US012681099B2

(12) United States Patent
Tsumoto

(10) Patent No.: US 12,681,099 B2
(45) Date of Patent: Jul. 14, 2026

(54) DETERMINATION METHOD OF BATTERY PACK AND MANUFACTURING METHOD OF VEHICLE

(71) Applicant: TOYOTA JIDOSHA KABUSHIKI KAISHA, Toyota (JP)

(72) Inventor: Tomohiro Tsumoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 371 days.

(21) Appl. No.: 18/329,888

(22) Filed: Jun. 6, 2023

(65) Prior Publication Data

US 2024/0069115 A1 Feb. 29, 2024

(30) Foreign Application Priority Data

Aug. 25, 2022 (JP) ................................. 2022-134311

(51) Int. Cl.
G01R 31/385 (2019.01)
G01R 31/389 (2019.01)
G01R 31/382 (2019.01)

(52) U.S. Cl.
CPC ......... *G01R 31/385* (2019.01); *G01R 31/389* (2019.01)

(58) Field of Classification Search
CPC .. G01R 31/385; G01R 31/389; G01R 31/378; G01R 31/3865; G01R 31/382; G01R 31/00; H01M 10/48; H01M 10/486; H01M 10/4285; H01M 2220/20; H01M 10/00; H01M 2220/00; Y02E 60/10; B62D 65/02; B07C 5/344; G01N 25/72; H01J 7/00
See application file for complete search history.

(56) References Cited

U.S. PATENT DOCUMENTS

| | | | | |
|---|---|---|---|---|
| 9,197,089 B2 * | 11/2015 | Choe | ................... | H01M 10/443 |
| 2005/0001627 A1 * | 1/2005 | Anbuky | ............... | G01R 31/392 |
| | | | | 700/297 |
| 2009/0146663 A1 * | 6/2009 | Takeno | ............... | H01M 10/486 |
| | | | | 324/426 |
| 2013/0322488 A1 * | 12/2013 | Yazami | ............... | H01M 10/486 |
| | | | | 374/100 |
| 2019/0195957 A1 | 6/2019 | Chiba | | |

(Continued)

FOREIGN PATENT DOCUMENTS

| | | | | | |
|---|---|---|---|---|---|
| CN | 101013765 A | * | 8/2007 | | |
| CN | 105742736 B | * | 1/2018 | ........ | H01M 10/4285 |

(Continued)

OTHER PUBLICATIONS

Sasaki_JP6046472B2_2016_English_Translation (Year: 2016).*

(Continued)

*Primary Examiner* — Catherine T. Rastovski
*Assistant Examiner* — Toni D Sauncy
(74) *Attorney, Agent, or Firm* — Oliff PLC

(57) ABSTRACT

A determination method for determining whether or not a battery pack is normal, the method comprising a step of measuring a time-dependent change in at least one of a temperature and an output voltage of the battery pack while heating the battery pack, and determining whether or not the battery pack is normal based on the measured time-dependent change. According to this determination method, it is possible to accurately determine whether or not the battery pack is normal.

5 Claims, 1 Drawing Sheet

(56) References Cited

U.S. PATENT DOCUMENTS

| | | | | |
|---|---|---|---|---|
| 2020/0319259 | A1* | 10/2020 | Pressman | G05B 19/042 |
| 2022/0057455 | A1* | 2/2022 | Fasching | H02J 7/0048 |
| 2022/0179007 | A1* | 6/2022 | Chida | H02J 7/04 |
| 2022/0289030 | A1* | 9/2022 | Pressman | G01R 31/396 |
| 2023/0120067 | A1* | 4/2023 | Yun | G01R 31/367 |
| | | | | 702/63 |
| 2024/0266625 | A1* | 8/2024 | Takahashi | H01M 10/625 |

FOREIGN PATENT DOCUMENTS

| | | | |
|---|---|---|---|
| JP | 2006-339070 | A | 12/2006 |
| JP | 2008-060032 | A | 3/2008 |
| JP | 2013-114986 | A | 6/2013 |
| JP | 6046472 | B2 * | 12/2016 |
| JP | 2019-114437 | A | 7/2019 |
| JP | 2019-158578 | A | 9/2019 |

OTHER PUBLICATIONS

Lopez, et al., "Characterization of Lithium-Ion Battery Thermal Abuse Behavior Using Experimental and Computational Analysis", Journal of The Electrochemical Society, 162 (10) A2163-A2173 (2015) A2163 (Year: 2015).*

Liao, et al., "A survey of methods for monitoring and detecting thermal runaway of lithium-ion batteries", Journal of Power Sources Oct. 1, 2019 (Year: 2019).*

Lin(CN101013765A)Translation_UsedForExamination (Year: 2007).*

Hales, et al., "Isothermal Temperature Control for Battery Testing and Battery Model Parameterization", SAE International Journal of Electrified Vehicles, 2021, vol. 10, No. 2 (2021), pp. 105-122 (Year: 2021).*

Ecker, et al., "Parameterization of a Physico-Chemical Model of a Lithium-Ion Battery: I. Determination of Parameters", Journal of The Electrochemical Society, 162 A1836m, 2015. (Year: 2015).*

Lu (CN 105742736 B)-Translation (Year: 2018).*

* cited by examiner

DETERMINATION METHOD OF BATTERY PACK AND MANUFACTURING METHOD OF VEHICLE

CROSS-REFERENCE TO RELATED APPLICATION

This application claims priority to Japanese Patent Application No. 2022-134311 filed on Aug. 25, 2022, incorporated herein by reference in its entirety.

BACKGROUND

1. Technical Field

The technology disclosed in this specification relates to a determination method of a battery pack.

2. Description of Related Art

Japanese Unexamined Patent Application Publication No. 2019-114437 (JP 2019-114437 A) discloses a determination method for determining whether a battery cell is a genuine product or a non-genuine product. In this determination method, an internal resistance at the time of shipment of the battery cell is calculated based on a change in a charging rate of the battery cell according to the number of cycles of charging and discharging of the battery cell, and it is determined whether the battery cell is a genuine product or a non-genuine product based on the calculated internal resistance at the time of shipment.

SUMMARY

In the determination method of JP 2019-114437 A, there is a possibility that an erroneous determination may occur when a non-genuine product has an internal resistance similar to that of a genuine product. The present specification proposes a new determination method for determining whether a battery pack is normal.

A determination method of item 1 disclosed in the present specification determines whether a battery pack is normal. The determination method includes a step of measuring a change with time of at least one of a temperature and an output voltage of the battery pack while heating the battery pack, and determining whether the battery pack is normal based on the measured change with time.

The determination of whether the battery pack is normal may be a determination of whether the battery pack is a genuine product or a non-genuine product.

When there is an abnormality in an electrode or an electrolyte inside a battery pack, the battery pack may self-generate heat when the battery pack is heated. Therefore, it is possible to determine whether the battery pack is normal by measuring a time-dependent change in a temperature of the battery pack while heating the battery pack. When there is an abnormality in the electrode, the electrolyte, or a separator inside the battery pack, an output voltage of the battery pack may decrease when the battery pack is heated. Therefore, it is possible to determine whether the battery pack is normal by measuring the time-dependent change of the output voltage of the battery pack while heating the battery pack. As described above, according to the determination method of item 1, it is possible to determine whether the battery pack is normal.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
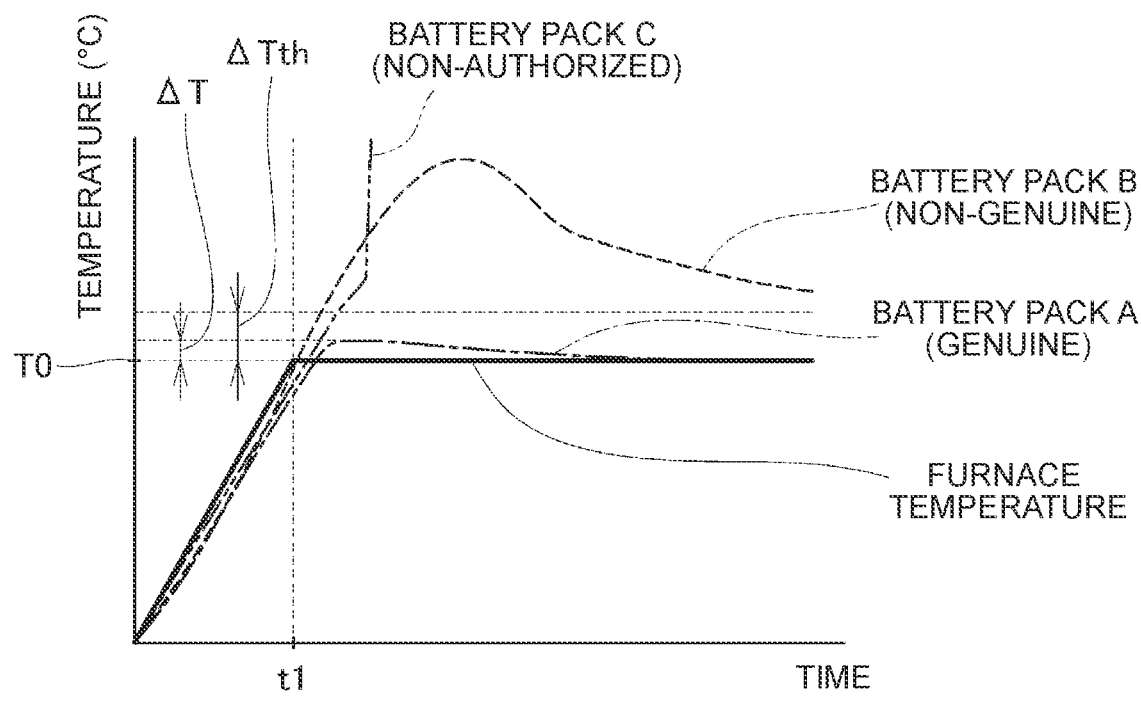
FIG. 1 is a graph showing time-dependent changes in temperature in a furnace and temperature of a battery pack in a determination step.

Following item 1 above, features of the technology disclosed herein are listed below.

Item 2

The determination method according to item 1, wherein in the step, an ambient temperature around the battery pack is controlled to a constant value.

Item 3

The determination method according to item 1 or 2, wherein in the step, when the temperature increase amount of the battery pack with respect to the ambient temperature around the battery pack exceeds a reference value, it is determined that the battery pack is abnormal.

Item 4

The determination method according to any one of items 1 to 3, wherein in the step, when the amount of decrease in the output voltage of the battery pack exceeds a reference value, it is determined that the battery pack is abnormal.

Item 5

A method of manufacturing a vehicle, comprising:

Performing the method according to any one of items 1 to 4; and

The method includes a step of mounting the battery pack determined to be normal in the determination method on a vehicle.

According to the determination method of the above item 2, a more accurate determination is possible.

According to the determination method of the above item 3, it is possible to accurately detect an abnormality in the battery pack.

According to the determination method of the above item 4, it is possible to accurately detect an abnormality in the battery pack.

In the determination method of the embodiment described below, it is determined whether the target battery pack is a genuine product (that is, a product supplied to the manufacturer in a genuine manner) or a non-genuine product. This determination method includes a determination step of measuring a time-dependent change in temperature and output voltage of the battery pack while heating the battery pack. In the determination step, the battery pack is housed in a furnace, and the temperature in the furnace (i.e., the temperature of the air in the furnace) is changed as shown in FIG. 1. The temperature in the furnace corresponds to the ambient temperature around the battery pack. Here, in the time t1, the temperature in the furnace is increased so that the temperature in the furnace reaches the temperature T0 (e.g., 110° C.), and after the time t1, the temperature in the furnace is maintained at the temperature T0 (i.e., constant value) for a predetermined time (e.g., 3 hours). The temperature of the battery pack is detected by a temperature sensor. A voltage sensor is connected to an output terminal of the battery pack in the furnace via a wiring, and an output voltage of the battery pack is detected.

FIG. 1 shows the change with time of the temperature of the battery packs A to C during the determination step. The battery pack A is a genuine product. The battery packs B and C are non-genuine. The electrodes and the electrolytic solution inside the battery pack A, which is a genuine product, are thermally stable. In the battery pack A, the self-heating hardly occurs. Therefore, the temperature of the battery pack A substantially coincides with the temperature in the furnace. On the other hand, in the battery pack B which is an irregular product, at least one of the electrode and the electrolytic solution reacts with each other by heating inside, and self-heating occurs. Therefore, the temperature of the battery pack B is significantly higher than the temperature T0 after the time-period t1. In addition, in the battery pack C that is an irregular product, thermal runaway occurs due to self-heating. Therefore, the temperature of the battery pack C rises to an extremely high temperature after t1 of hours. In the determination step, an increase $\Delta T$ of the temperature of the battery pack with respect to the temperature T0 in the furnace is monitored. When the increase amount $\Delta T$ exceeds the reference value $\Delta Tth$, it is determined that the battery pack is an unauthorized product. When the increase amount $\Delta$ does not exceed the reference value $\Delta Tth$, it is determined that the battery pack is a genuine product. In FIG. 1, since the temperature increase amount $\Delta T$ of the battery pack A does not exceed the reference value $\Delta Tth$ once, it is determined that the battery pack A is a genuine product. Further, in FIG. 1, since the temperature increase amount $\Delta$ of the battery packs B and C exceeds the reference value $\Delta Tth$, it is determined that the battery packs B and C are non-regular products. As described above, since the thermal stability of the battery pack is different depending on whether the battery pack is a genuine product or a non-genuine product, it is possible to accurately determine whether the battery pack is a genuine product or a non-genuine product by measuring the time-dependent change of the temperature of the battery pack while heating the battery pack.

Figure 2:
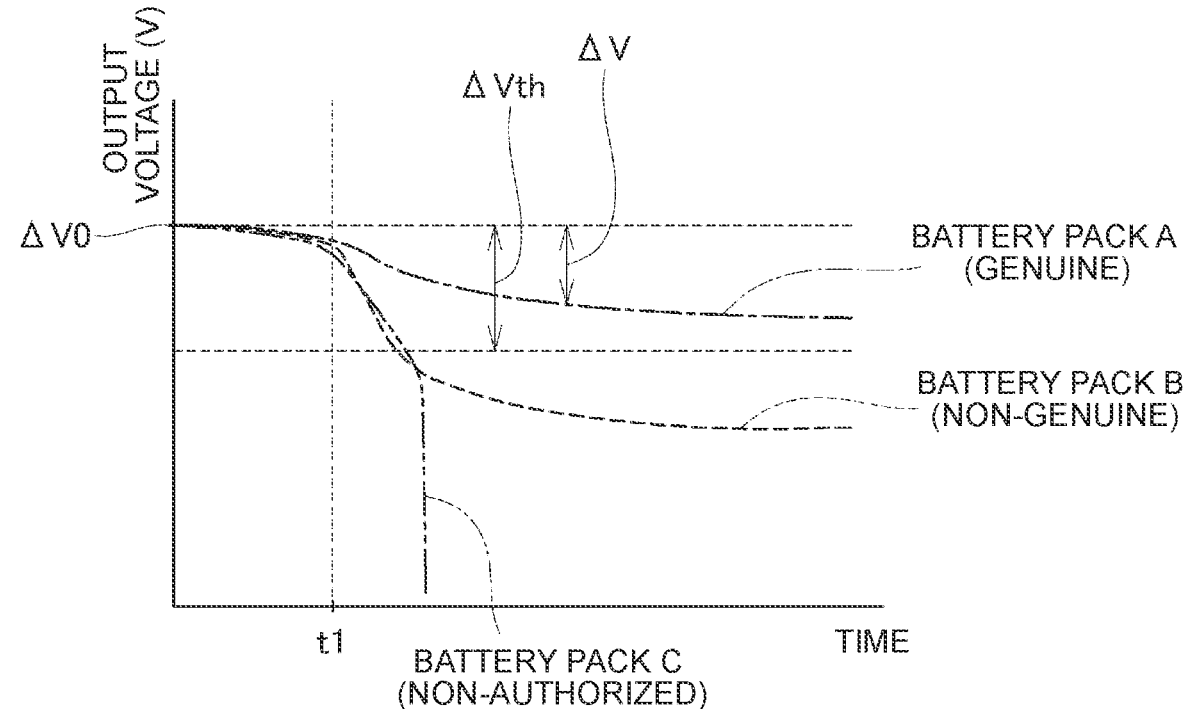
FIG. 2 is a graph showing a change with time in the output voltage of the battery pack in the determination step.

FIG. 2 shows changes over time in the output voltages of the battery packs A to C during the determination process. Since the electrode, the electric field liquid, and the separator inside the battery pack A are thermally stable, the amount of decrease $\Delta V$ of the output voltage (that is, the amount of decrease of the output voltage with respect to the initial value V0) when the battery pack A is heated is small. That is, in the battery pack A, the output voltage does not significantly change between the heating time and the initial value. On the other hand, the electrode, the electric field liquid, and the separator inside the battery pack B are thermally unstable. Therefore, when the battery pack B is heated, self-discharge occurs inside the battery pack B due to deterioration of the separator, or the internal resistance of the battery pack B changes due to deterioration of the electrode or the electrolytic solution, thereby lowering the output voltage of the battery pack B. Therefore, as shown in FIG. 2, the decrease amount $\Delta V$ of the output voltage of the battery pack B is large. Further, when the battery pack C is heated, the output voltage of the battery pack C is greatly reduced due to deterioration of the electrodes, the electric field liquid, and the separator inside. In the determination step, the amount of decrease $\Delta V$ in the output voltage of the battery pack is monitored. When the decrease $\Delta V$ exceeds the reference value $\Delta Vth$ (that is, when the output voltage falls below $V0-\Delta Vth$), it is determined that the battery pack is an unauthorized product. When the decrease amount $\Delta V$ does not exceed the reference value $\Delta Vth$, it is determined that the battery pack is a genuine product. In FIG. 2, since the decrease amount $\Delta V$ of the output voltage of the battery pack A does not exceed the reference value $\Delta Vth$ once, the battery pack A is determined to be a genuine product. Further, in FIG. 2, since the decrease amount $\Delta V$ of the output voltages of the battery packs B and C exceeds the reference value $\Delta Vth$, it is determined that the battery packs B and C are non-regular products. As described above, since the stability of the output voltage at the time of heating the battery pack is different depending on whether the battery pack is a genuine product or a non-genuine product, it is possible to accurately determine whether the battery pack is a genuine product or a non-genuine product by measuring the change with time of the output voltage of the battery pack while heating the battery pack.

In the above-described embodiment, while the battery pack is heated, the change with time of both the temperature and the output voltage of the battery pack is measured. However, while the battery pack is heated, only the time-dependent change of either the temperature or the output voltage of the battery pack may be measured. The determination method disclosed in this specification may be combined with other determination methods to more accurately determine whether the product is a genuine product or a non-genuine product.

Further, in the above-described embodiment, the ambient temperature of the battery pack was maintained at a constant temperature (i.e., temperature T0) after the time t1. By maintaining the ambient temperature at a constant temperature as described above, it is possible to accurately determine whether the battery pack is a genuine product or a non-genuine product. However, in other embodiments, the environmental temperature of the battery pack may be changed.

In the above-described embodiment, it is determined whether the battery pack is a genuine product or a non-genuine product. However, according to this determination method, it is also possible to determine whether or not there is an abnormality in a battery pack of a genuine product. For example, even a genuine battery pack may cause an abnormality inside the battery pack due to an inappropriate use method. In such a case, according to the determination method disclosed in the present specification, it is possible to detect an abnormality of a genuine battery pack.

In addition, the battery pack may be mounted on the vehicle after the determination that the battery pack is normal is made by the above-described determination method of the battery pack. Since it is difficult to heat the battery pack after the vehicle is mounted, the determination method disclosed in the present specification can be performed before the vehicle is mounted.

The embodiments have been described in detail above. However, these are merely illustrative and do not limit the scope of the claims. The technology described in the claims includes those in which the specific examples described above are variously modified and modified. The technical elements described in this specification or in the drawings exhibit technical usefulness alone or in various combinations. The technical elements described in this specification or in the drawings are not limited to the combinations recited in the claims filed. The technology illustrated in the present specification or the drawings achieves a plurality of objects at the same time. The technology illustrated in the present specification or the drawings has technical usefulness in achieving one of the objects.

What is claimed is:

1. A determination method of determining whether a battery pack has a first characteristic that the battery pack is genuine, the determination method comprising a step of measuring both a temperature and an output voltage of the battery pack simultaneously while heating the battery pack, and determining whether the battery pack has the first characteristic based on the measured temperature and output voltage of the battery pack while heating the battery pack, wherein in the step, a first determination is made based on whether a temperature increase amount of the battery pack with respect to an ambient temperature around the battery pack exceeds a reference value, a second determination is made based on whether a voltage decrease amount exceeds a threshold value, and the battery pack is determined to have a second characteristic, that the battery pack is non-genuine, when either the first determination or the second determination indicates that the battery pack has the second characteristic, the ambient temperature around the battery pack being a temperature in a furnace.

2. The determination method according to claim 1, wherein in the step, the ambient temperature around the battery pack is controlled to be a constant value.

3. The determination method according to claim 2, wherein in the step, the temperature in the furnace is increased to a predetermined temperature and thereafter maintained at the predetermined temperature for a predetermined time.

4. A manufacturing method comprising:

a step of executing the determination method according to claim 1; and a step of installing the battery pack determined to have the first characteristic in the determination method in a vehicle.

5. The determination method according to claim 1, wherein in the step, the temperature increase amount resulting from self-heating due to an internal abnormality in the battery pack is monitored.

* * * * *